US006895026B2

(12) United States Patent
Miyajima et al.

(10) Patent No.: US 6,895,026 B2
(45) Date of Patent: May 17, 2005

(54) HEAT SINK AND SEMICONDUCTOR LASER APPARATUS AND SEMICONDUCTOR LASER STACK APPARATUS USING THE SAME

(75) Inventors: Hirofumi Miyajima, Hamamatsu (JP); Hirofumi Kan, Hamamatsu (JP); Toshio Naitoh, Hamamatsu (JP); Hirokazu Ohta, Hamamatsu (JP); Takeshi Kanzaki, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 437 days.

(21) Appl. No.: 09/773,509

(22) Filed: Feb. 2, 2001

(65) Prior Publication Data

US 2001/0004370 A1 Jun. 21, 2001

Related U.S. Application Data

(63) Continuation-in-part of application No. PCT/JP99/01968, filed on Apr. 13, 1999.

(30) Foreign Application Priority Data

Aug. 18, 1998 (JP) .......................................... 10-231575

(51) Int. Cl.[7] ................................................. H01S 3/04
(52) U.S. Cl. .............................. 372/36; 372/34; 372/35; 372/43
(58) Field of Search .............................. 372/34, 35, 36, 372/43

(56) References Cited

U.S. PATENT DOCUMENTS

| 4,494,171 | A | * | 1/1985 | Bland et al. ................. 361/704 |
| 5,005,640 | A | * | 4/1991 | Lapinski et al. ............. 165/170 |
| 5,079,619 | A |   | 1/1992 | Davidson ..................... 357/81 |
| 5,105,429 | A | * | 4/1992 | Mundinger et al. ........... 372/34 |
| 5,745,514 | A | * | 4/1998 | Patel et al. ................... 372/43 |
| 5,903,583 | A |   | 5/1999 | Ullman et al. ................ 372/35 |
| 6,097,744 | A | * | 8/2000 | Takigawa et al. ............. 372/34 |

FOREIGN PATENT DOCUMENTS

| DE | 40 17 749   | 12/1991 |
| DE | 43 15 580   | 11/1994 |
| DE | 195 06 093  | 8/1996  |
| JP | 5-152475    | 6/1993  |
| JP | 5-304383    | 11/1993 |
| JP | 6-326226    | 11/1994 |
| JP | 7-249721    | 9/1995  |
| JP | 8-139478    | 5/1996  |
| JP | 8-139479    | 5/1996  |
| JP | 8-213523    | 8/1996  |
| JP | 8-227953    | 9/1996  |
| JP | 9-102568    | 4/1997  |
| JP | 10-185467   | 7/1998  |

* cited by examiner

*Primary Examiner*—Minsun Oh Harvey
*Assistant Examiner*—Cornelius H Jackson
(74) *Attorney, Agent, or Firm*—Morgan, Lewis & Bockius, LLP

(57) ABSTRACT

A semiconductor laser stack apparatus 1 comprises three semiconductor lasers 2a to 2c, two copper plates 3a and 3b, two lead plates 4a and 4b, a supply tube 5, a discharge tube 6, four insulating members 7a to 7d, and three heat sinks 10a to 10c. Here, the heat sink 10a to 10c is formed by a lower planar member 12 formed with a supply water path groove portion 22, an intermediate planar member 14 formed with a plurality of water guiding holes 38, and an upper planar member 16 formed with a discharge water path groove portion 30 which are successively stacked one upon another, whereas their contact surfaces are joined together. The heat sink 10a to 10c is provided with pillar pieces 24 for connecting the bottom face of supply water path groove portion 22 and the lower face of intermediate planar member 14 to each other, and pillar pieces 32 for connecting the bottom face of discharge water path groove portion 30 and the upper face of intermediate planar member 14 to each other.

19 Claims, 11 Drawing Sheets

HEAT SINK AND SEMICONDUCTOR LASER APPARATUS AND SEMICONDUCTOR LASER STACK APPARATUS USING THE SAME

RELATED APPLICATION

The present application is a continuation-in-part application of PCT application No. PCT/JP99/01968 filed on Apr. 13, 1999, designating U.S.A. and now pending.

BACKGROUND OF THE INVENTION

1. Field of the Invention

The present invention relates to a heat sink employed for dissipating heat from a heating element such as semiconductor device, and a semiconductor laser apparatus and semiconductor laser stack apparatus using the same.

2. Related Background Art

Known as a heat sink for dissipating heat from a heating element such as semiconductor device is one having a structure for circulating cooling water therein, such as the one disclosed in Japanese Patent Application Laid-Open No. HEI 8-139479, for example. This heat sink comprises a pipe-like supply water path for supplying pressurized cooling water, a discharge water path for discharging the cooling water, and a nozzle for injecting into the discharge water path the cooling water supplied to the supply water path. The cooling water injected from the nozzle under a high pressure efficiently dissipates heat from the heating element mounted at a part directly above the nozzle.

SUMMARY OF THE INVENTION

However, the heat sink in accordance with the above-mentioned prior art has a problem as follows. Namely, since the heat sink in accordance with the above-mentioned prior art has a pipe-like supply water path, the heat sink enhances its thickness, thereby becoming larger. Here, though the heat sink may be made thinner by reducing the diameter of pipe and so forth, the supply water path, the discharge water path, or the outer shape of heat sink will be more likely to deform due to the hydraulic pressure of the cooling water supplied to the supply water path if the heat sink is made thinner. Such a deformation may lower the water-passing efficiency of the supply water path and discharge water path, or the degree of contact between the device or the like to be cooled and the heat sink, thereby deteriorating the heat-dissipating efficiency of the device or the like. Therefore, it is an object of the present invention to provide a thin heat sink having a high heat-dissipating efficiency, and a semiconductor laser apparatus and semiconductor laser stack apparatus using the same.

For overcoming the above-mentioned problem, the present invention provides a heat sink comprising a first planar member having an upper face formed with a first groove portion, a second planar member having a lower face formed with a second groove portion, and a partition disposed between the upper face of the first planar member and the lower face of the second planar member; the partition being formed with a hole for communicating a first space and a second space to each other, the first space being formed by the first groove portion and a lower face of the partition, the second space being formed by the second groove portion and an upper face of the partition; the first space being provided with a first connecting member for connecting a bottom face of the first groove portion and the lower face of partition to each other; the heat sink further comprising a supply port for supplying a fluid into the first space and a discharge port for discharging the fluid from the second space.

The heat sink can be made thinner since it is constituted by first and second planar members provided with groove portions, and a partition provided with a hole. Also, since the first connecting member is provided, the heat sink can resist the pressure by which a fluid supplied into the first space presses the bottom face of first groove portion and the lower face of partition. Therefore, the first space is prevented from deforming, which will keep the second space and the heat sink as a whole from deforming. As a result, the passing efficiency of fluid improves, and the degree of contact between the device or the like to be cooled and the heat sink increases, whereby the heat-dissipating efficiency of the device or the like ameliorates.

The present invention provides a semiconductor laser apparatus comprising the above-mentioned heat sink and a semiconductor laser mounted on an upper face of the second planar member of the heat sink.

Since the above-mentioned heat sink is used, the semiconductor laser apparatus can be made smaller, and the heat-dissipating efficiency of semiconductor laser improves, whereby stable laser light can be outputted.

The present invention provides a semiconductor laser stack apparatus comprising first and second heat sinks and first and second semiconductor lasers, the first and second heat sinks being the above-mentioned heat sink, the first semiconductor laser being held between an upper face of the second planar member of the first heat sink and a lower face of the first planar member of the second heat sink, the second semiconductor laser being mounted on an upper face of the second planar member of the second heat sink.

Since the above-mentioned heat sink is used, the semiconductor laser stack apparatus can be made smaller, and the heat-dissipating efficiency of semiconductor laser improves, whereby stable laser light can be outputted.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The semiconductor laser stack apparatus in accordance with an embodiment of the present invention will be explained with reference to drawings. The semiconductor laser apparatus and heat sink of the present invention are included in the semiconductor laser stack apparatus in accordance with this embodiment.

Figure 1:
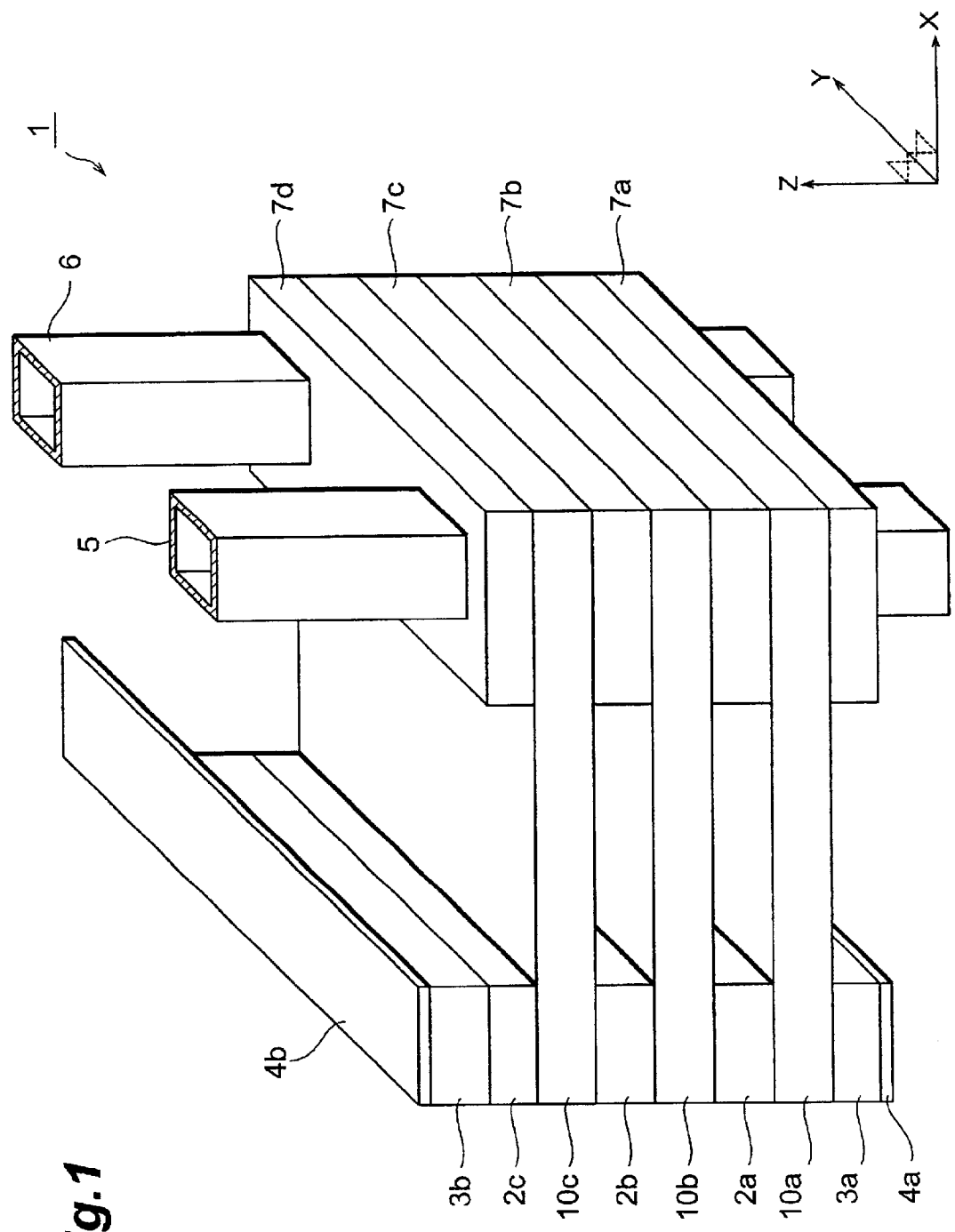
FIG. 1 is a perspective view of a semiconductor laser stack apparatus.

First, the configuration of the semiconductor laser stack apparatus in accordance with this embodiment will be explained. FIG. 1 is a perspective view of the semiconductor laser stack apparatus in accordance with this embodiment. As shown in FIG. 1, the semiconductor laser stack apparatus 1 in accordance with this embodiment comprises three semiconductor lasers 2a to 2c, two copper plates 3a and 3b, two lead plates 4a and 4b, a supply tube 5, a discharge tube 6, four insulating members 7a to 7d, and three heat sinks 10a to 10c. In the following, each constituent will be explained. For convenience of explanation, the positive z-axis direction and negative z-axis direction in FIG. 1 will be referred to as the upper and lower sides, respectively, in the following.

The semiconductor lasers 2a to 2c are semiconductor lasers each having a plurality of laser emission points arranged in a predetermined direction (y-axis direction). The semiconductor laser 2a is held between the upper face of heat sink 10a (the upper face of an upper planar member 16 which will be mentioned later, ditto in the following) and the lower face of heat sink 10b (the lower face of a lower planar member 12 which will be mentioned later, ditto in the following); the semiconductor laser 2b is held between the upper face of heat sink 10b and the lower face of heat sink 10c; and the semiconductor laser 2c is mounted on the upper face of heat sink 10c. Here, each of the semiconductor lasers 2a to 2c is disposed such that the direction in which its laser emission points are arranged and the upper faces of heat sinks 10a to 10c are parallel to each other, whereas the emission surface of each of the semiconductor lasers 2a to 2c is substantially flush with respective one side face of the heat sinks 10a to 10c.

The lower face of semiconductor laser 2a is electrically connected to the lead plate 4a by way of the copper plate 3a, whereas the upper face of semiconductor laser 2c is electrically connected to the lead plate 4b by way of the copper plate 3b. Here, if voltage is applied between the lead plates 4a and 4b, then laser light can be outputted from the semiconductor lasers 2a to 2c.

Each of the supply tube 5 and discharge tube 6 is disposed so as to penetrate through the heat sinks 10a to 10c. In further detail, the supply tube 5 is connected to a supply port 44 (which will be explained later in detail) formed in each of the heat sinks 10a to 10c, whereas the discharge tube 6 is connected to a discharge port 46 (which will be explained later in detail) formed in each of the heat sinks 10a to 10c. Therefore, a fluid such as cooling water can be supplied from the supply tube 5 to the heat sinks 10a to 10c, and the cooling water can be discharged from the heat sinks 10a to 10c to the discharge tube 6.

The insulating members 7a, 7b, 7c, 7d made of rubber are disposed, respectively, on the lower side of heat sink 10a, in the gap between the upper face of heat sink 10a and the lower face of heat sink 10b, in the gap between the upper face of heat sink 10b and the lower face of heat sink 10c, and on the upper side of heat sink 10c so as to surround the supply tube 5 and discharge tube 6. The insulating members 7a to 7d function to secure insulation between the individual heat sinks and prevent the cooling water from leaking.

Figure 2A:
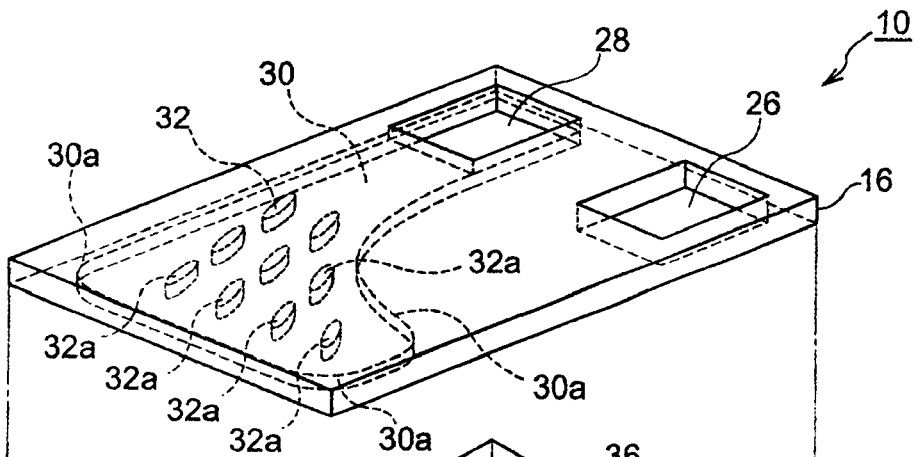
FIGS. 2A to 2C are exploded perspective views of a heat sink.
Figure 2B:
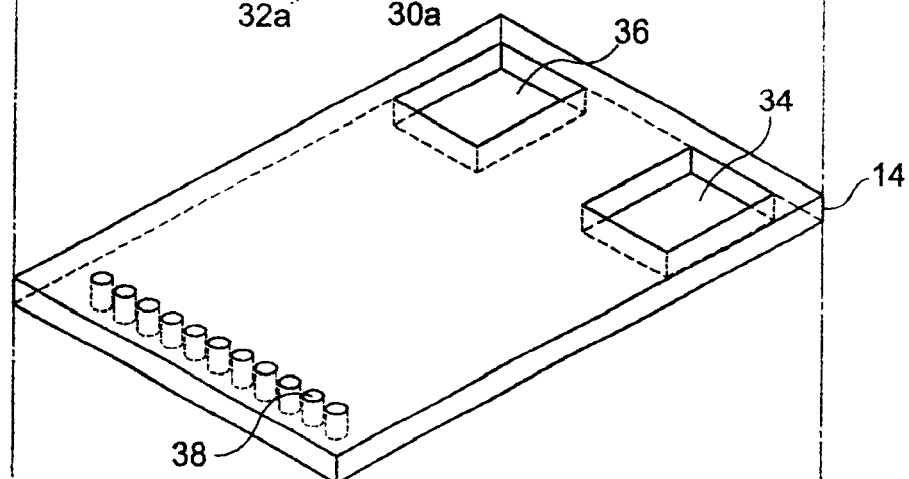
Figure 2C:
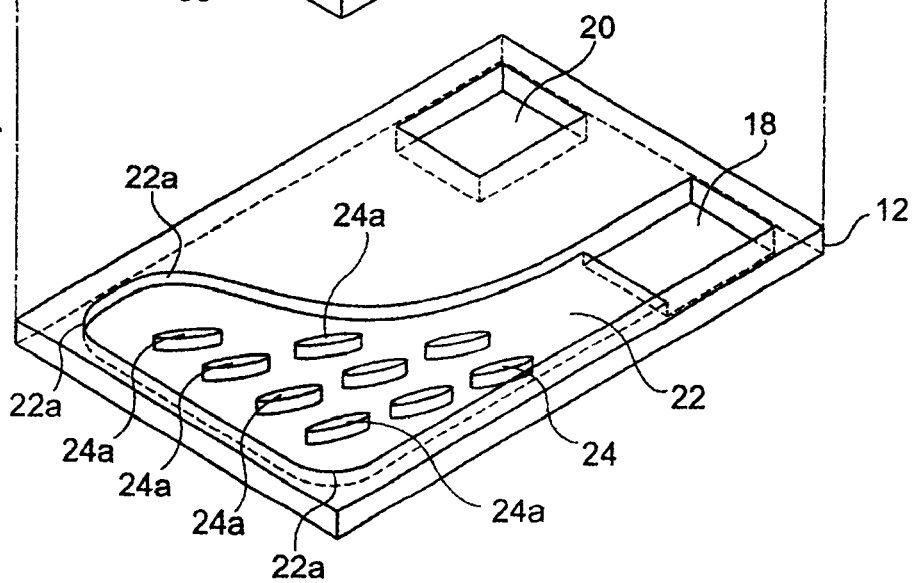
Figure 3:
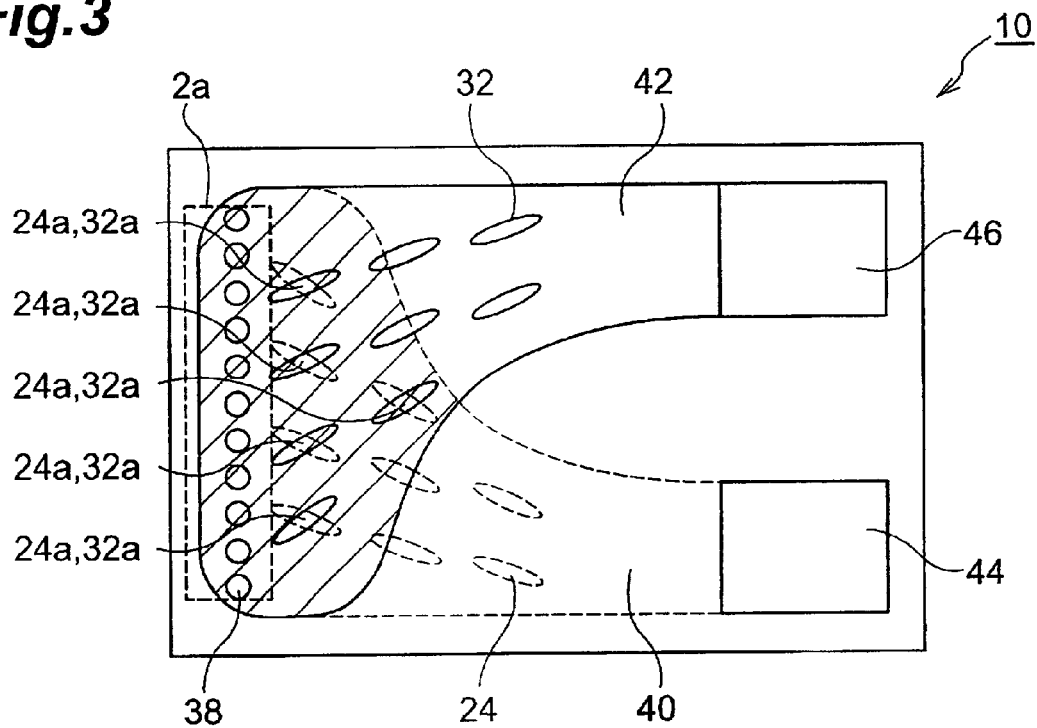
FIG. 3 is an explanatory view of the heat sink as seen from thereabove.
Figure 4:
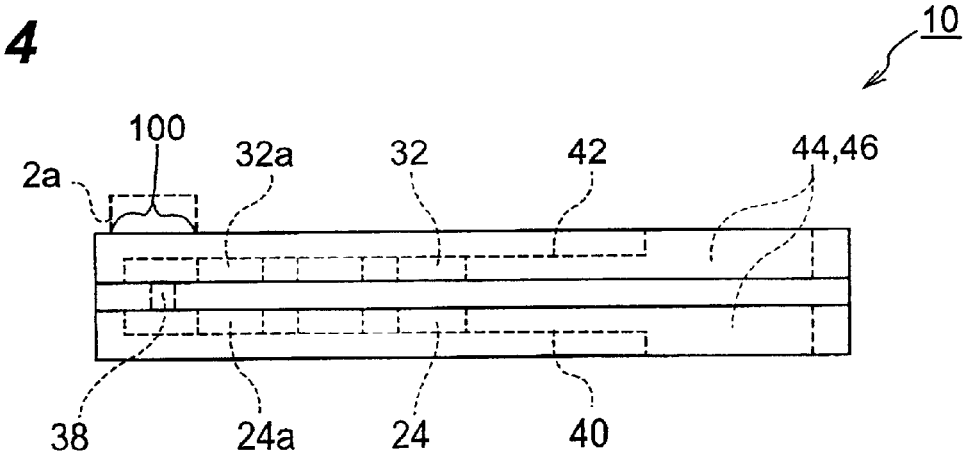
FIG. 4 is an explanatory view of the heat sink as seen from a side thereof.

The heat sinks 10a to 10c are configured as follows. Here, since the heat sinks 10a to 10c have the same configuration, only the heat sink 10a will be explained in the following. FIGS. 2A to 2C are exploded perspective views of the heat sink 10a, FIG. 3 is an explanatory view of the heat sink 10a as seen from thereabove, and FIG. 4 is an explanatory view of the heat sink 10a as seen from a side thereof.

As shown in FIGS. 2A to 2C, the heat sink 10 is formed by a lower planar member 12 (first planar member), an intermediate planar member 14 (partition), and an upper planar member 16 (second planar member) which are successively stacked one upon another, whereas their contact surfaces are joined together by the diffusion bonding method, by brazing, or by use of an adhesive.

The lower planar member 12 is a plate made of copper having a thickness of about 400 $\mu$m with two through holes 18, 20. A supply water path groove portion 22 (first groove portion) having a depth of about 200 $\mu$m is formed on the upper face (the surface in contact with the intermediate planar member 14) side of the lower planar member 12. One end side of the supply water path groove portion 22 is connected to the through hole 18, whereas the other end side spreads in the widthwise direction of lower planar member 12 (y-axis direction of FIG. 1). Also, in the supply water path groove portion 22, corner portions 22a are rounded in order to lower the flow resistance of the cooling water flowing through the heat sink 10a and reduce its stagnation.

Figure 5:
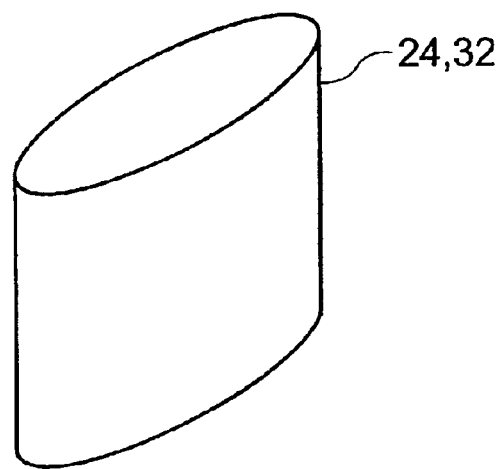
FIG. 5 is a perspective view of a pillar piece.

The supply water path groove portion 22 is provided with a plurality of pillar pieces (first connecting members) 24 extending in the thickness direction of lower planar member 12 (z-axis direction of FIG. 1). The pillar piece 24 is a pillar member made of copper with a height of about 200 $\mu$m having an elliptical cross section as shown in FIG. 5, whereas its one end face is firmly attached to the supply water path groove portion 22.

Here, employable for forming the supply water path groove portion 22 and pillar pieces 24 are a method in which the supply water path groove portion 22 and pillar pieces 24 are formed by etching at the same time, a method in which the supply water path groove portion 22 is formed by etching and then pillar pieces 24 made separately therefrom are bonded thereto, and the like.

The upper planar member 16 is also a plate made of copper having a thickness of about 400 $\mu$m with two through holes 26, 28 located at respective positions corresponding to the through holes 18, 20 of the lower planar member 12. A discharge water path groove portion 30 (second groove portion) having a depth of about 200 $\mu$m is formed on the lower face (the surface in contact with the intermediate planar member 14) side of the upper planar member 16. One end side of the discharge water path groove portion 30 is connected to the through hole 28, whereas the other end side spreads in the widthwise direction of upper planar member 16. Here, at least a part of the discharge water path groove portion 30 is formed at a part (the hatched part of FIG. 3) overlapping the supply water path groove portion 22 formed in the lower planar member 12. Also, in the discharge water path groove portion 30, corner portions 30a are rounded in order to lower the flow resistance of the cooling water flowing through the heat sink 10a and reduce its stagnation.

The discharge water path groove portion 30 is provided with a plurality of pillar pieces (second connecting members) 32 extending in the thickness direction of upper planar member 16. The pillar piece 32 is a pillar member made of copper with a height of about 200 μm having an elliptical cross section as shown in FIG. 5, whereas its one end face is firmly attached to the discharge water path groove portion 30. Here, the discharge water path groove portion 30 and pillar pieces 32 are formed by methods similar to those for forming the supply water path groove portion 22 and pillar pieces 24.

The intermediate planar member 14 is a plate made of copper having a thickness of about 100 μm having two through holes 34, 36 at respective positions corresponding to the through holes 18, 20 of the lower planar member 12. The part where the supply water path groove portion 22 formed in the lower planar member 12 and the discharge water path groove portion 30 formed in the upper planar member 16 overlap each other is formed with a plurality of water guiding holes 38. The water-guiding holes 38, each having a substantially circular cross section, are formed by etching the intermediate planar member 14 from both sides.

In particular, the upper face of upper planar member 16 has a semiconductor laser mounting area 100 for mounting the semiconductor laser 2a, which is a heating element to be cooled, whereas a plurality of water guiding holes 38 are disposed at positions opposing the semiconductor laser mounting area 100. Namely, since the semiconductor laser 2a has a substantially rectangular parallelepiped form, the semiconductor laser mounting area 100 has a rectangular form, and a plurality of water guiding holes 38 are formed so as to be arranged in a row in the longitudinal direction of this rectangular form (y-axis direction of FIG. 1).

When the upper face of lower planar member 12 and the lower face of intermediate planar member 14 are joined together, and the upper face of intermediate planar member 14 and the lower face of upper planar member 16 are joined together, as shown in FIG. 3 or 4, a supply water path 40 (first space) for supplying cooling water is formed by the supply water path groove portion 22 formed in the lower planar member 12 and the lower face of intermediate planar member 14 and, similarly, a discharge water path 42 (second space) for discharging the cooling water is formed by the discharge water path groove portion 30 formed in the upper planar member 16 and the upper face of intermediate planar member 14. Here, the water guiding hole 38 has a sufficiently small cross-sectional area for injecting into the discharge water path 42 the cooling water supplied to the supply water path 40.

Since the pillar piece 24 has a height equal to the depth of supply water path groove portion 22, its end face opposite from the end face secured to the supply water path groove portion 22 is bonded to the intermediate planar member 14. As a result, the pillar piece 24 connects the bottom face of supply water path groove portion 22 and the lower face of intermediate planar member 14 to each other. Similarly, the pillar piece 32 connects the bottom face of discharge water path groove portion 30 and the upper face of intermediate planar member 14 to each other.

The through hole 18 formed in the lower planar member 12, the through hole 34 formed in the intermediate planar member 14, and the through hole 26 formed in the upper planar member 16 are connected together, so as to form the supply port 44 for supplying cooling water to the supply water path 40; whereas the through hole 20 formed in the lower planar member 12, the through hole 36 formed in the intermediate planar member 14, and the through hole 28 formed in the upper planar member 16 are connected together, so as to form a discharge port 46 for discharging the cooling water from the discharge water path 42.

Here, the pillar piece 24 has a cross section in which the length in the direction from the supply port 44 to the water guiding holes 38 (first direction) is longer than that in a direction (second direction) substantially perpendicular thereto. The pillar piece 32 has a cross section in which the length in the direction from the water guiding holes 38 to the discharge port 46 (third direction) is longer than that in a direction (fourth direction) substantially perpendicular thereto. Among the pillar pieces 24 and 32, the pillar pieces 24a and 32a disposed at the part (hatched part of FIG. 3) where the supply water path 40 and the discharge water path 42 overlap each other are located at respective positions overlapping each other.

Operations and effects of the semiconductor laser stack apparatus in accordance with this embodiment will now be explained. In the semiconductor laser stack apparatus 1, three planar members, i.e., lower planar member 12, intermediate planar member 14, and upper planar member 16, constitute the heat sink 10a to 10c. As a consequence, the heat sinks 10a to 10c can be constructed very thin, whereby the semiconductor laser stack apparatus 1 can attain a very small configuration.

Here, since cooling water pressurized to about 2 to 4 $kgf/cm^2$ is normally caused to flow through the supply water path 40, a force to expand the supply water path 40 is generated at the inner wall of supply water path 40. However, since the thickness of the intermediate planar member 14 separating the supply water path 40 and the discharge water path 42 from each other and the thickness of the part of lower planar member 12 formed with the supply water path groove portion 22 are very thin, i.e., about 100 μm and about 200 μm, respectively, the above-mentioned force mainly emerges as a pressure pressing the inner wall of supply water path 40 in the vertical direction (z-axis direction of FIG. 1).

The pillar pieces 24 provided in the supply water path 40 pull the inner wall of supply water path 40 against the above-mentioned pressure, thereby preventing the supply water path 40 from deforming. Therefore, the passing efficiency of cooling water in the supply water path 40 improves, thereby ameliorating the heat-dissipating efficiency of semiconductor lasers 2a to 2c. As a result, it becomes possible for the semiconductor lasers 2a to 2c to output stable laser light.

On the other hand, the discharge water path 42 is formed above the supply water path 40 by way of the intermediate planar member 14, whereas the thickness of the intermediate planar member 14 separating the supply water path 40 and the discharge water path 42 from each other is very thin, i.e., about 100 μm. Therefore, the discharge water path 42 is pushed by the supply water path 40, whereby a compressive force compressing the discharge water path 42 in the vertical direction (z-axis direction of FIG. 1) is generated.

By contrast, the pillar pieces 32 provided in the discharge water path 42 push the inner wall of discharge water path 42 from inside against the above-mentioned compressive force, thereby preventing the discharge water path 42 from deforming. Therefore, the passing efficiency of cooling water in the discharge water path 40 improves, thereby ameliorating the heat-dissipating efficiency of semiconductor lasers 2a to 2c. As a result, it becomes possible for the semiconductor lasers 2a to 2c to output stable laser light.

Since the supply water path 40 and discharge water path 42 are prevented from deforming, the heat sinks 10a to 10c themselves are kept from deforming. Therefore, the degree of contact between the semiconductor lasers 2a to 2c to be cooled and the heat sinks 10a to 10c increases, whereby the heat-dissipating efficiency of semiconductor lasers 2a to 2c improves. As a result, it becomes possible for the semiconductor lasers 2a to 2c to output stable laser light.

Figure 6:
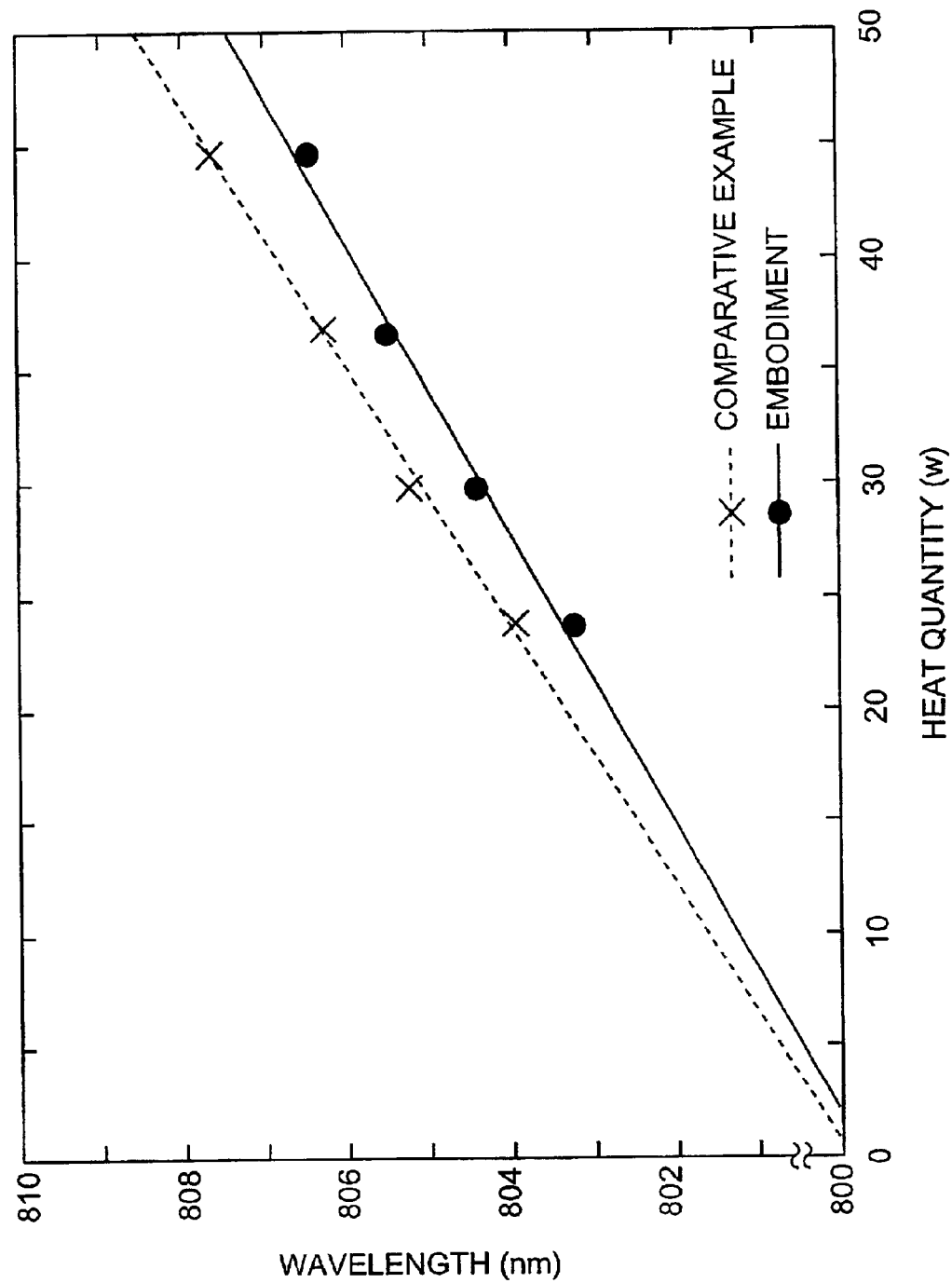
FIG. 6 is a chart showing the relationship between heat quantity and wavelength.

FIG. 6 is a graph showing the relationship between the heat quantity outputted from the semiconductor lasers 2a to 2c and the peak wavelength of laser light outputted from the semiconductor lasers 2a to 2c in each of the respective cases using the heat sinks 10a to 10c having the pillar pieces 24, 32 (this embodiment) and heat sinks having no pillar pieces 24, 32 (comparative example). Here, cooling water (temperature at the time of supply: 20° C.) is caused to flow through each heat sink at 0.20 l/min. As can be seen from FIG. 6, when compared with the heat sinks having no pillar pieces 24, 32, the change in peak wavelength of the laser light outputted from the semiconductor lasers 2a to 2c in the heat sinks 10a to 10c having the pillar pieces 24, 32 is smaller even when the heat quantity outputted from the semiconductor lasers 2a to 2c becomes greater, whereby stable laser light can be outputted.

Further, since the heat sinks 10a to 10c are prevented from deforming, the positioning of laser emission points becomes easier even when the semiconductor lasers 2a to 2c having a plurality of laser emission points arranged in a predetermined direction are mounted, whereby the optical coupling efficiency with respect to external optical systems can be enhanced. Also, since the heat sinks 10 yield a higher rigidity, they can be made further smaller and thinner.

In the semiconductor laser stack apparatus 1 in accordance with this embodiment, the heat sinks 10a to 10c can be made by relatively simple steps of forming groove portions such as the supply water path groove portion 22 and discharge water path groove portion 30, forming holes such as water guiding holes 38, and so forth, whereby its making is relatively easy. As a result, it becomes relatively easier to make the semiconductor laser stack apparatus 1.

Since a plurality of pillar pieces 24 or 32 are provided in the heat sinks 10a to 10c, the semiconductor laser stack apparatus 1 in accordance with this embodiment can more efficiently prevent the supply water path 40 or discharge water path 42 from deforming, and can further improve the heat-dissipating efficiency of semiconductor lasers 2a to 2c. As a result, it becomes possible for the semiconductor lasers 2a to 2c to output very stable laser light.

Since the pillar pieces 24 or 32 each have a substantially elliptical cross section and are arranged such that their major axes are oriented in a predetermined direction in the heat sinks 10a to 10c, the flow resistance of cooling water can be lowered in the semiconductor laser stack apparatus 1 in accordance with this embodiment. Therefore, the passing efficiency of cooling water in the supply water path 40 or discharge water path 42 improves, thereby ameliorating the heat-dissipating efficiency of semiconductor lasers 2a to 2c. As a result, it becomes possible for the semiconductor lasers 2a to 2c to output stable laser light.

Since the pillar pieces 24a and 32a disposed at the part where the supply water path 40 and the discharge water path 42 overlap each other in the heat sinks 10a to 10c are located at respective positions overlapping each other, the pillar pieces 24a and 32a can cooperate to resist the above-mentioned pressure and compressive force, thereby enhancing the deformation preventing capacity of supply water path 40 and discharge water path 42. As a result, when compared with the case without such a configuration, the heat-dissipating efficiency of semiconductor lasers 2a to 2c can further be improved, whereby it becomes possible for the semiconductor lasers 2a to 2c to output more stable laser light.

Since the water guiding holes 38 are disposed at positions opposing the semiconductor laser mounting area 100 in the heat sinks 10a to 10c, the semiconductor laser stack apparatus 1 in accordance with this embodiment can effectively cool the semiconductor lasers 2a to 2c to be cooled. As a result, it becomes possible for the semiconductor lasers 2a to 2c to output stable laser light.

The semiconductor laser stack apparatus 1 in accordance with this embodiment has a plurality of water guiding holes 38 in the heat sink 10a to 10c. Consequently, it can cool the semiconductor lasers 2a to 2c uniformly over a wide range. As a result, spatially uniform laser light can be outputted.

In the semiconductor laser stack apparatus 1 in accordance with this embodiment, the water guiding holes 38 of heat sinks 10a to 10c have a sufficiently small cross-sectional area in order to inject into the discharge water path 42 the cooling water supplied to the supply water path 40. Therefore, the boundary layer in the inner wall of discharge water path 42 can be broken, whereby the cooling efficiency of semiconductor lasers 2a to 2c increases. As a result, it becomes possible for each of the semiconductor lasers 2a to 2c to output more stable laser light.

Since the semiconductor laser stack apparatus 1 in accordance with this embodiment comprises one supply tube 5 connected to the supply port 44 of each of the heat sinks 10a to 10c and one discharge tube 6 connected to the discharge port 46 of each of the heat sinks 10a to 10c, other connection tubes connecting the supply tube 5 and the supply port 44 to each other, other connection tubes connecting the discharge tube 6 and the discharge port 46 to each other, and the like become unnecessary, whereby a further smaller size is achieved.

Figure 7:
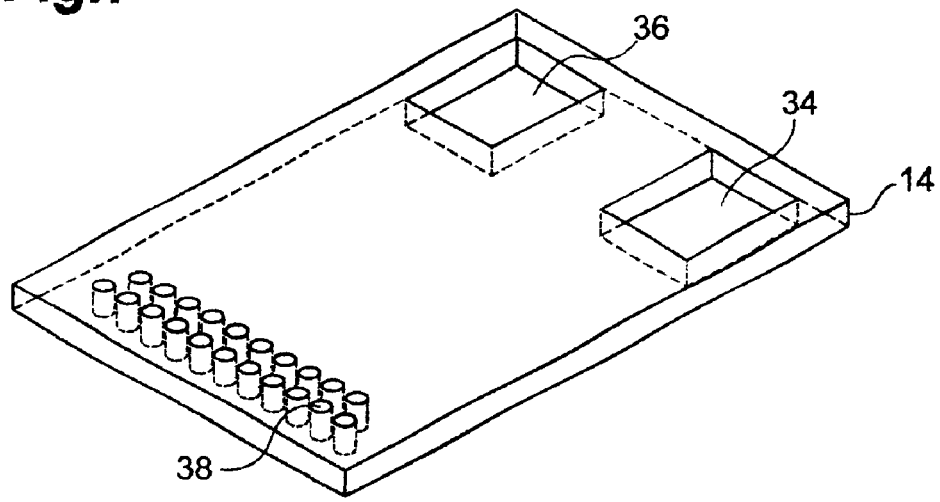
FIGS. 7 to 10 are perspective views of intermediate planar members.
Figure 8:
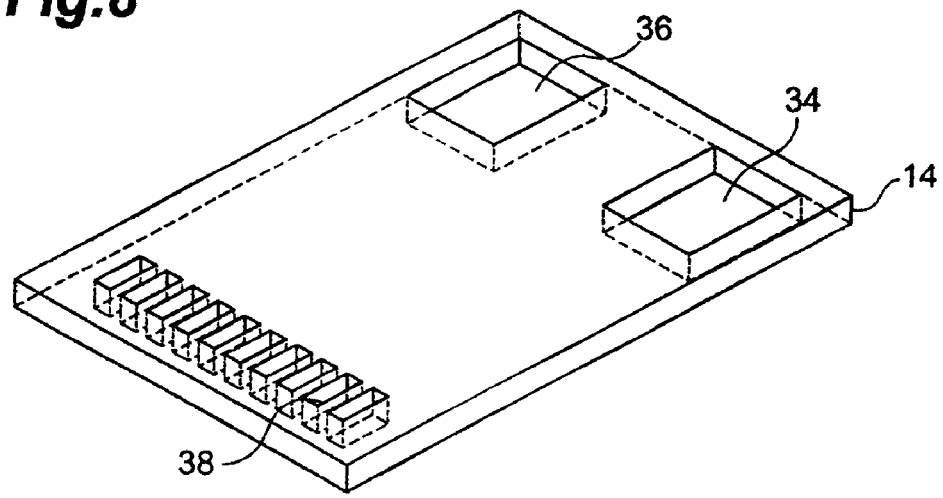
Figure 9:
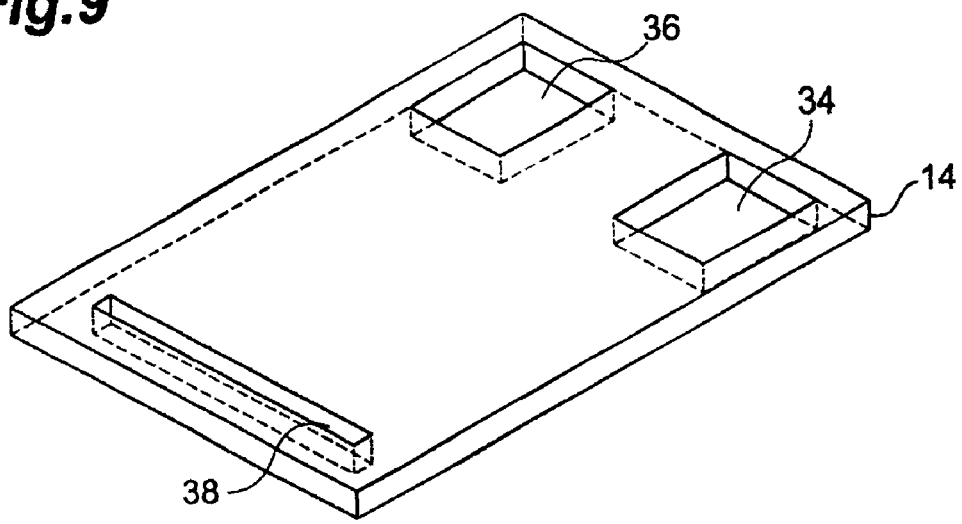
Figure 10:
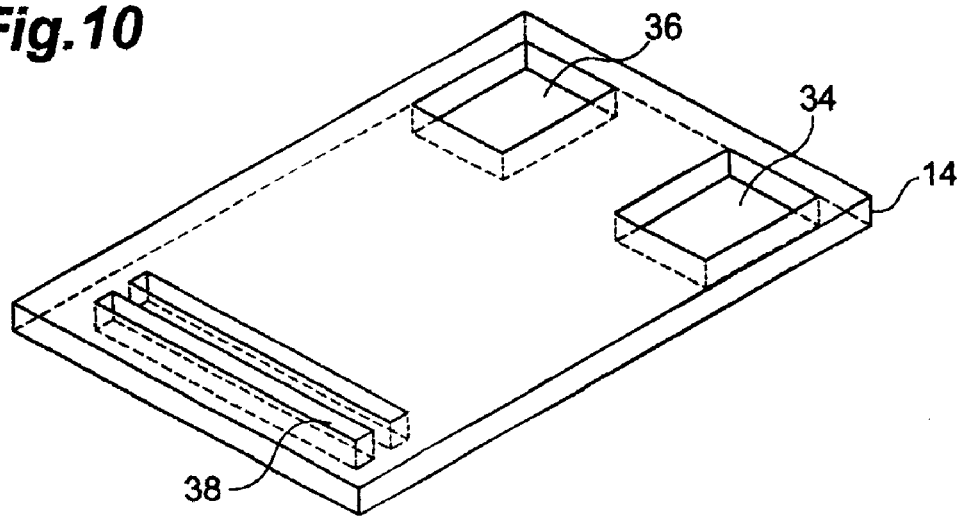

Though the plurality of water guiding holes 38 are formed so as to be arranged in a row in the longitudinal direction of semiconductor laser mounting area 100 in the heat sinks 10a to 10c in the semiconductor laser stack apparatus 1 in accordance with the above-mentioned embodiment, they may be formed so as to be arranged in two rows in the longitudinal direction of laser mounting area 100 as shown in FIG. 7. As shown in FIG. 8, slit-like water guiding holes 38 each extending in the transverse direction of the semiconductor laser mounting area 100 may be formed so as to be arranged in a row in the longitudinal direction of semiconductor laser mounting area 100. Also, one slit-like water guiding hole 38 extending in the longitudinal direction of semiconductor laser mounting area 100 may be formed as shown in FIG. 9, or two such guide holes may be arranged as shown in FIG. 10.

Figure 11:
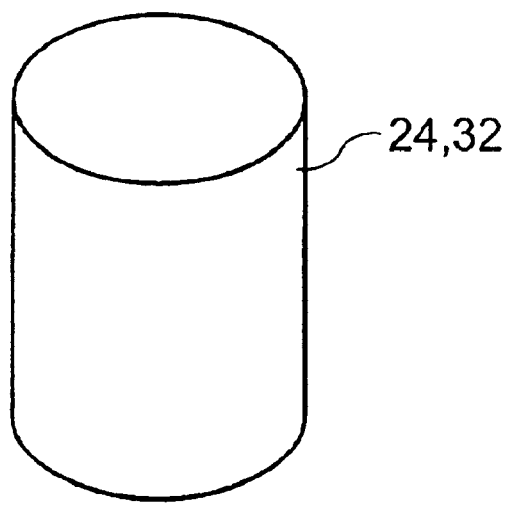
FIGS. 11 to 14 are perspective views of pillar pieces.

Though the pillar pieces 24, 32 are pillar members having an elliptical cross section in the heat sinks 10a to 10c in the semiconductor laser stack apparatus 1 in accordance with this embodiment, they may be cylindrical members as shown in FIG. 11. If the pillar pieces 24, 32 are formed as cylindrical members, then it becomes easier to form the pillar pieces 24, 32, while it becomes unnecessary to take account of the orientation of pillar pieces 24, 32 when disposing them in the supply water path 40 and discharge water path 42.

Figure 12:
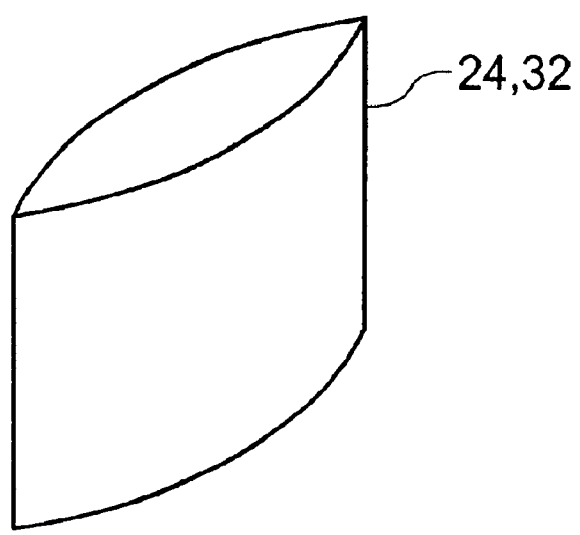
Figure 13:
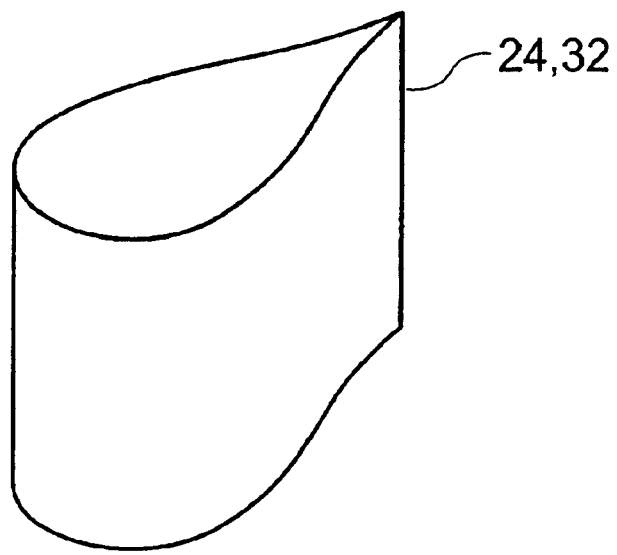

The pillar pieces 24, 32 may also be pillar members having a streamlined cross section such as one shaped like a blade as shown in FIG. 12, one shaped like a droplet as shown in FIG. 13, and the like. If the pillar pieces 24, 32 have such shapes, then flow resistance of cooling water can further be lowered.

Figure 14:
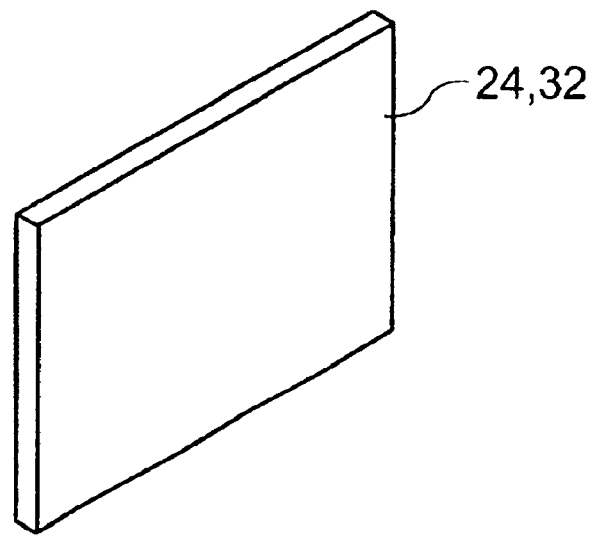

The pillar pieces 24, 32 may be sheet-like members as shown in FIG. 14. If the pillar pieces 24, 32 are sheet-like members, then it becomes easier to form the pillar pieces 24, 32.

Though the pillar pieces 24 have the same form in the heat sinks 10a to 10c in the semiconductor laser stack apparatus 1 in accordance with the above-mentioned embodiment, the form (including the surface form), size, arrangement, and the like of pillar pieces 24 can be adjusted appropriately so as to homogenize the pressure loss of the flow path from the supply port 44 to the water guiding holes 38 in order to uniformly cool a semiconductor laser or the like having a length of about 1 cm, for example.

Figure 15:
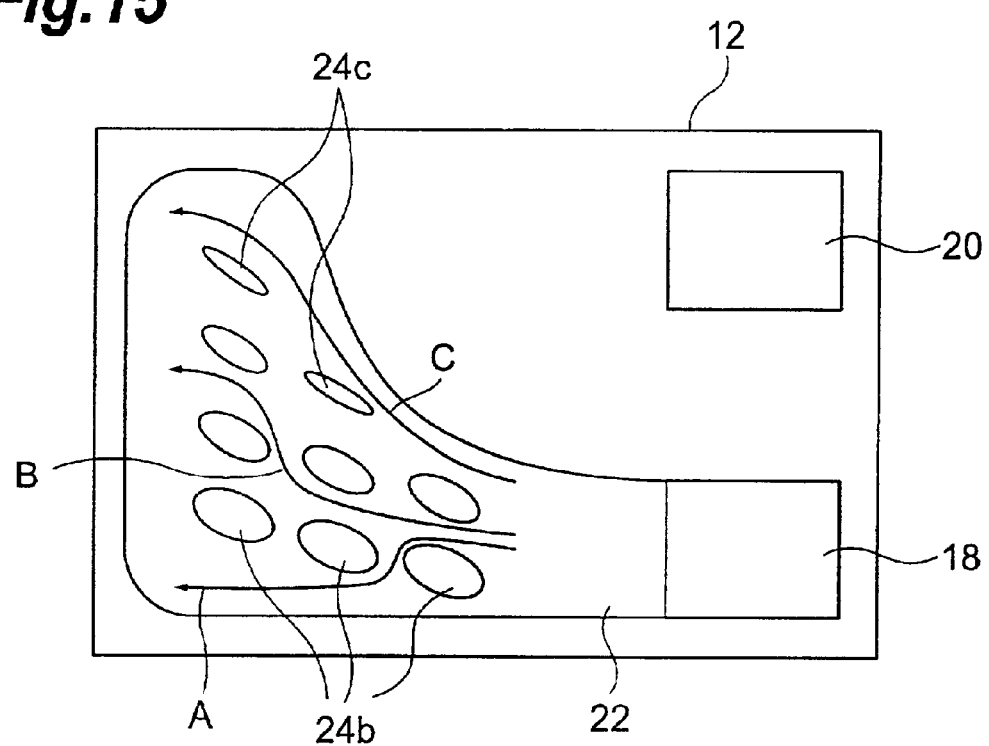
FIG. 15 is a plan view of a lower planar member.

Specifically, as shown in FIG. 15, for example, pillar pieces 24b disposed at a part (flow path A) having a shorter flow path length from the supply port 44 to the water guiding holes 38 each have a larger size and a cross section which is elliptical but closer to a true circle, whereas pillar pieces 24c disposed at a part (flow path C) having a longer flow path length from the supply port 44 to the water guiding holes 38 each have a smaller size and a cross section which is shaped like an elongated ellipsoid. If such pillar pieces 24b, 24c are used, then the pressure loss in flow paths A, B, C becomes uniform. As a result, the semiconductor lasers are cooled evenly, so that fluctuations in wavelength and output are eliminated, whereby reliability improves. Alternatively, the pressure loss in flow paths A, B, C can be made uniform by methods such as those in which the density at which the pillar pieces 24 are disposed is made smaller successively from the flow paths A to C, in which the surface of pillar pieces 24 is made smoother successively from the flow paths A to C, and the like.

Though the pillar pieces 24, 32 are formed in the lower planar member 12 and upper planar member 16, respectively, in the heat sink 10 in accordance with the above-mentioned embodiment, they may be formed in the intermediate planar member 14.

Figure 16A:
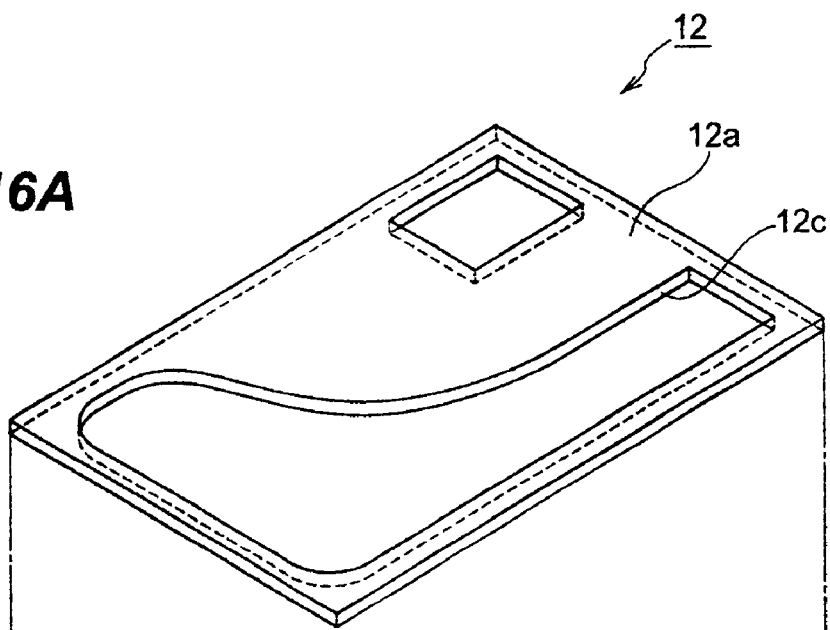
FIGS. 16A and 16B are exploded perspective views of a lower planar member.
Figure 16B:
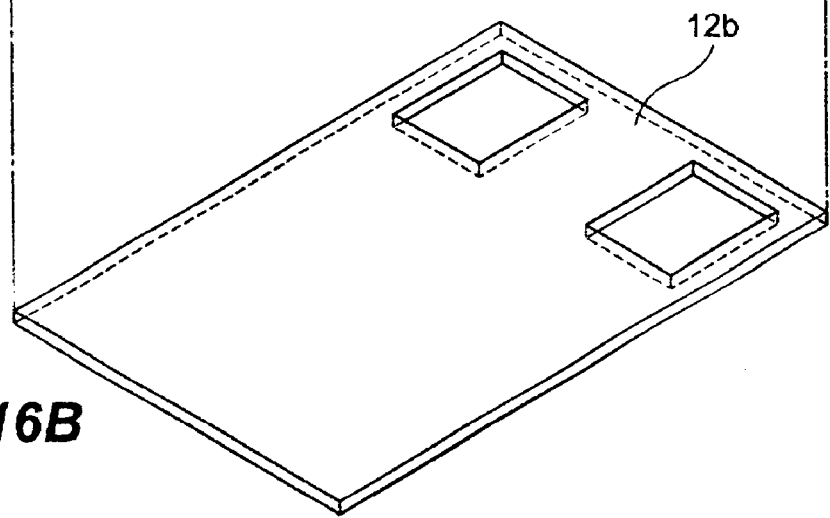

Though the supply water path groove portion 22 of lower planar member 12 in the heat sink 10a in the semiconductor laser stack apparatus 1 in accordance with the above-mentioned embodiment is formed by etching the upper face of the lower planar member 12, it may be formed as shown in FIGS. 16A and 16B by stacking and bonding a first plate 12a having a hole 12c for forming side faces of the supply water path groove portion 22 and a second plate 12b for forming the bottom face of supply water path groove portion 22 onto each other. In this case, the pillar pieces 24 are bonded to the bottom face of supply water path groove portion 22 after being made separately therefrom. Here, the upper planar member 16 can also be formed by stacking and bonding two plates as mentioned above.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A heat sink comprising:
   a first planar member having a first main face and second main face, the second main face having a first depressed portion thereon;
   a second planar member having a first main face and a second main face, the first main face having a second depressed portion thereof;
   a partition member sandwiched between the second main face of the first planar member and the first main face of the second planar member, and formed with a main first face and a main second face, the partition member having a plurality of holes passing through the first and the second main faces thereof, each of the plurality of holes having a substantially flat wall extending from the first main face of the partition member to the second main face of the partition member,
   the first main face of the partition member and the first depressed portion defining a first space having side walls, at least two of the side walls of the first space forming an intersection at a location proximate the plurality of holes, wherein the intersection of the side walls of the first space is rounded, the second main face of the partition member and the second depressed portion defining a second space having side walls, at least two of the side walls of the second space forming an intersection at a location proximate the plurality of holes, wherein the intersection of the side walls of the second space is rounded, the holes communicating the first space with the second space with areas in the first space which correspond to the holes being substantially spatially continuous and free of any dividing members;
   a supply port for supplying a fluid into the second space;
   a discharge port for discharging the fluid from the first space; and
   a first guide member provided in the second space for controlling flow of the fluid in the second space from the supply port to an area in the first space corresponding to the holes.

2. A heat sink according to claim 1, wherein a plurality of the first guide members is provided.

3. A heat sink according to claim 1, wherein the first guide member has a substantially circular cross section.

4. A heat sink according to claim 1, wherein the first main face of the second planar member has a heating element mounting area for mounting a heating element to be cooled, the holes being disposed opposing the heating element mounting area.

5. A heat sink according to claim 1, wherein each of the holes has a sufficiently small cross section for injecting said fluid into the first space.

6. A heat sink according to claim 1, wherein the first guide member has a cross section whose length in a first direction from the supply port to the holes is longer than the length in a second direction substantially perpendicular to the first direction, the cross section being shaped like a curve on the supply port side.

7. A heat sink according to claim 6, wherein the first guide member has a substantially elliptical cross section.

8. A semiconductor laser apparatus comprising:
   the heat sink according to claim 1, and
   a semiconductor laser mounted on an upper face of said second planar member of said heat sink.

9. A semiconductor laser apparatus according to claim 8, wherein said semiconductor laser has a plurality of laser emission points arranged in a predetermined direction,
   said predetermined direction being oriented so as to become substantially parallel to said upper face of second planar member.

10. A semiconductor laser stack apparatus comprising first and second heat sinks and first and second semiconductor lasers;
    the first and second heat sinks being the heat sink according to claim 1;

the first semiconductor laser being held between an upper face of the second planar member of the first heat sink and a lower face of the first planar member of the second heat sink;

the second semiconductor laser being mounted on said upper face of second planar member of said second heat sink.

11. A semiconductor laser stack apparatus according to claim 10, wherein the first and second semiconductor lasers have a plurality of laser emission points arranged in a predetermined direction, said predetermined direction being oriented so as to become substantially parallel to said upper faces of first and second planar members.

12. A semiconductor laser stack apparatus according to claim 10, further comprising:

a supply tube connected to both of said supply port of said first heat sink and said supply port of said second heat sink; and a discharge tube connected to both of said discharge port of said first heat sink and said discharge port of said second heat sink.

13. A heat sink according to claim 1, further comprising a second guide member provided in the first space for controlling flow from the areas corresponding to the holes to the discharge port in the first space.

14. A heat sink according claim 13, wherein a plurality of the second guide members is provided.

15. A heat sink according to claim 13, wherein the second guide member has a substantially circular cross section.

16. A heat sink according to claim 13, wherein said first and second guide members disposed at a part where the first and second spaces overlap each other are located at respective positions overlapping each other.

17. A heat sink according to claim 13, wherein the second guide member has a cross section whose length in a third direction from the holes to the discharge port is longer than the length in a fourth direction substantially perpendicular to the third direction, the cross section being shaped like a curve on the hole side.

18. A heat sink according to claim 17, wherein the second guide member has a substantially elliptical cross section.

19. A heat sink comprising:

an integrally formed first planar member having a first main face and a second main face, the second main face having a first groove portion formed therein which extends only part of the way through the first planar in a direction from the second main face toward the first main face;

an integrally formed second planar member having a first main face and a second main face, the first main face of the second planar member having a second groove portion formed therein which extends only part of the way through the second planar member in a direction from the first main face of the second planar member to the second main face of the second planar member;

a planar partition member having a first main face and a second main face positioned between the second main face of the first planar member and the first main face of the second planar member, the partition member having a hole passing through the first and second main faces of the partition member, wherein the first groove portion of the first planar member and the first main face of the planar partition member form a first space, the second groove portion of the second planar member and the second main face of the planar partition member form a second space, and the hole in the planar partition member communicates the first space with the second space;

a supply port for supplying a fluid into one of the first and second spaces; and a discharge port for discharging the fluid from the other of the first and second spaces;

wherein at least one of the first and second spaces is bounded by side walls, at least two of the side walls forming an intersection proximate the hole passing through the first and second main faces of the partition member, the intersection of the side walls being rounded.

* * * * *